United States Patent
Yang et al.

(10) Patent No.: US 7,889,532 B2
(45) Date of Patent: Feb. 15, 2011

(54) BIT LINE SENSE AMPLIFIER OF SEMICONDUCTOR MEMORY DEVICE HAVING OPEN BIT LINE STRUCTURE

(75) Inventors: Hyang-Ja Yang, Gyeonggi-do (KR); Su-Yeon Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/545,706

(22) Filed: Aug. 21, 2009

(65) Prior Publication Data

US 2009/0310432 A1  Dec. 17, 2009

Related U.S. Application Data

(62) Division of application No. 11/834,516, filed on Aug. 6, 2007, now Pat. No. 7,639,556.

(30) Foreign Application Priority Data

Aug. 22, 2006  (KR)  ............... 2006-0079526

(51) Int. Cl.
*G11C 5/06* (2006.01)
*G11C 7/00* (2006.01)
*G11C 7/02* (2006.01)

(52) U.S. Cl. ............... 365/63; 365/72; 365/202; 365/203; 365/205; 365/207

(58) Field of Classification Search ............ 365/63, 365/72, 202, 203, 205, 207
See application file for complete search history.

(56) References Cited

U.S. PATENT DOCUMENTS 5,973,983 A * 10/1999 Hidaka ............ 365/230.03
6,765,833 B2 * 7/2004 Khang ............ 365/203

* cited by examiner

*Primary Examiner*—Ly D Pham
(74) *Attorney, Agent, or Firm*—Volentine & Whitt, PLLC

(57) ABSTRACT

In an embodiment, a bit line sense amplifier of a semiconductor memory device with an open bit line structure includes sense amplifier blocks, first voltage drivers, and a second voltage driver. The sense amplifier blocks include a first sense amplifier and a second sense amplifier, each sensing and amplifying a signal difference between a bit line and a complementary bit line. The first voltage drivers apply a power source voltage to the first sense amplifier, and the second voltage driver applies a ground voltage to the second sense amplifier. The first voltage drivers are disposed for every two or more sense amplifier blocks in a bit line sense amplifier region in which the sense amplifier blocks are arranged, and the second voltage driver is disposed in a conjunction region in which a control circuit is located to control the sense amplifier blocks. Both capacitive noise and device size are minimized.

5 Claims, 9 Drawing Sheets

BIT LINE SENSE AMPLIFIER OF SEMICONDUCTOR MEMORY DEVICE HAVING OPEN BIT LINE STRUCTURE

CROSS-REFERENCE TO RELATED PATENT APPLICATIONS

This application is a Divisional of U.S. patent application Ser. No. 11/834,516, filed on Aug. 6, 2007, now pending, which claims priority under 35 U.S.C. §119 from Korean Patent Application No. 10-2006-0079526, filed on Aug. 22, 2006, in the Korean Intellectual Property Office, the entire contents of which are hereby incorporated by reference

BACKGROUND

1. Field of the Invention

The present invention relates to a semiconductor memory device, and more particularly, to a semiconductor memory device having an open bit line structure.

2. Description of the Related Art

A bit line sense amplifier of a semiconductor memory device, such as a Dynamic Random Access Memory (DRAM), amplifies a slight signal difference generated in a bit line when a memory cell is accessed and charge sharing occurs between the memory cell and the bit line. Thus, the bit line sense amplifier is a circuit indispensable to the operation of the semiconductor memory device.

In general, a bit line structure of a semiconductor memory device is categorized into an open bit line structure and a folded bit line structure. The open bit line structure includes a bit line and a complimentary bit line (inverted bit line) that extend from a bit line sense amplifier and in opposite directions. The folded bit line structure also includes a bit line and a complementary bit line that extend from a bit line sense amplifier but in the same direction. The bit line and the complementary bit line form a pair of bit lines.

All other things being equal, the semiconductor memory device having an open bit line structure includes more memory cells than one having a folded bit line structure. Accordingly, the open bit line structure is widely used.

FIG. 1 illustrates a semiconductor memory device 5 having an open bit line structure, including a bit line BL and a complementary bit line BLB, which are aligned to left and right sides of sense amplifier blocks SA. The sense amplifier blocks SA constitute a bit line sense amplifier.

Memory cells MC for storing data are arranged in an area where bit lines BL and sub-word lines SWL intersect one another and in an area where complementary bit lines BLB and sub-word lines SWL intersect one another. Each of the memory cells MC includes an NMOS transistor as a cell transistor, and a cell capacitor. Details of one of the memory cells MC are shown in FIG. 1.

When a sub-word line, e.g., a sub-word line SWL1, is activated and the memory cells MC to the left side of the sense amplifier blocks SA are selected, the memory cells to the right side of the sense amplifier blocks SA are not selected. And thus, noise generated in bit lines BL1 and BL2 (noise caused by a coupling capacitance) is different from noise generated in complementary bit lines BLB1 and BLB2. That is, a mismatch occurs between the coupling capacitances of the bit lines and the complementary bit lines.

Therefore, in the semiconductor memory device 5 having the open bit structure, a mismatch in the coupling capacitance may lead to an unstable sensing operation of the bit line sense amplifier with respect to the bit lines BL or the complementary bit lines BLB.

FIG. 2 illustrates the configuration of the bit line sense amplifier of FIG. 1. Referring to FIG. 2, the bit line sense amplifier includes a plurality of sense amplifier blocks SA1 through SAn, a plurality of NMOS sense amplifier drivers (hereinafter referred to as the "NSA drivers") 10, and a PMOS sense amplifier driver (hereinafter referred to as the "PSA driver") 20.

The sense amplifier blocks SA1 through SAn are arranged between memory cell regions MCA in which a plurality of memory cells are placed. The NSA drivers 10, each including an NMOS transistor, are distributed over a bit line sense amplifier region close to the bit line sense amplifier, in order to improve the sensing capability of NMOS sense amplifier NSA. For example, one NSA driver 10 may be placed for every two or more sense amplifier blocks. Each of the NSA drivers 10 is located between NMOS transistors that form a precharge unit PCH of one of the sense amplifier blocks SA1 through SAn, and an NMOS transistor that forms a second column selection unit CS2 of one of the sense amplifier block SA1, . . . , SAn.

The PSA driver 20 includes a PMOS transistor that is larger than the NMOS transistor of the NSA driver 10, and is located in a conjunction area CONJ between sub-word line driver regions SWD. In the sub-word line driver regions SWD, a sub-word line driver is located to drive sub-word lines connected to cell transistors of memory cells aligned in the memory cell regions MCA. Each of the sub-word lines is connected to a main word line via the sub-word line driver. A control circuit that controls the sub-word line drivers and the bit line sense amplifier is located in the conjunction region CONJ.

The first sense amplifier block SA1 includes a first column selection unit CS1, a PMOS sense amplifier PSA, the NMOS sense amplifier NSA, an equalization unit EQ, a precharge unit PCH, and a second column selection unit CS2.

The first column selection unit CS1 either connects the bit line BL to a local input/output (I/O) line LIO that is connected to a data I/O pin, or disconnects them from each other, in response to a signal transmitted via the first column selection line CSL1. The first column selection unit CS1 includes an NMOS transistor.

The PMOS sense amplifier PSA senses and amplifies a signal difference between the bit line BL and the complementary bit line BLB, in response to power source voltage VDD transmitted via a power source voltage supply line LA. The PMOS sense amplifier PSA includes a plurality of PMOS transistors. The PSA driver 20 applies the power source voltage VDD to the PMOS sense amplifier PSA via the power source voltage supply line LA, in response to a first sensing enable signal LAE.

The NMOS sense amplifier NSA senses and amplifies a signal difference between the bit line BL and the complementary bit line BLB, in response to ground voltage VSS applied via a ground voltage supply line LAB. The NMOS sense amplifier NSA includes a plurality of NMOS transistors. The NSA drivers 10 applies the ground voltage VSS to the NMOS sense amplifier NSA via the ground voltage supply line LAB, in response to a second sensing enable signal LABE. The NSA driver 10 is illustrated in greater detail in FIG. 3.

The equalization unit EQ is configured to equalize the voltage of the bit line BL with that of the complementary bit line BLB in response to a signal transmitted via a precharge/equalization signal line PEQ. The equalization unit EQ includes an NMOS transistor.

The precharge unit PCH is configured to precharge the voltages of the bit line BL and the complementary bit line to a precharge voltage (power source voltage VDD/2), in response to a signal transmitted via the precharge/equalization signal line PEQ. The precharge unit PCH includes a plurality of NMOS transistors. The precharge voltage is applied via a precharge voltage line VBL.

The second column selection unit CS2 either connects the complementary bit line BLB to a complementary local I/O line LIOB that is connected to the data I/O pin, or disconnects them from each other, in response to a signal transmitted via a second column selection line CSL2. The second column selection unit CS2 includes an NMOS transistor.

The elements of each of the second through $n^{th}$ sense amplifier blocks SA2 through SAn are the same as those of the first sense amplifier block SA1.

FIG. 3 illustrates a connection between the NSA driver 10 and the ground voltage supply line LAB, which are illustrated in FIG. 2. Referring to FIG. 3, the NSA driver 10 may be embodied as an NMOS transistor that operates in response to the second sensing enable signal LABE.

A source region of the NMOS transistor 10 is connected to the ground voltage line VSS (first metal line) via a first direct contact DC1. A drain region of the NMOS transistor 10 is connected to a second metal line M2 via a second direct contact DC2. Also, the second metal line M2 is connected to the ground voltage supply line LAB (first metal line) through a via VIA. The arrangement direction of the ground voltage line VSS is the same as that of the ground voltage supply line LAB.

The drain region of the NMOS transistor 10 is connected via the second metal line M2 because the NMOS transistor forming the NSA driver 10 is arranged in a small layout region located between the NMOS transistors forming the precharge unit PCH and the NMOS transistor forming the second column selection unit CS2, as illustrated in FIG. 2.

Since the NSA driver 10 is connected to the ground voltage supply line LAB through the second direct contact DC2, the second metal line M2, and the via VIA, the resistance between the NSA driver 10 and the ground voltage supply line LAB increases. Thus, the NSA driver 10 may not always be capable of stably applying the ground voltage VSS for a stable sensing operation of the NMOS sensing amplifier NSA. To counter this, the size, and thus the current capacity, for example, of the transistor of the NSA driver 10 may be increased, but then the size of the semiconductor memory chip may be increased.

FIG. 4 is a layout diagram of the sense amplifier block of FIG. 2. In FIG. 4, CS1L, PSAL, NSAL, PEQL, and CS2L respectively denote the layouts of the NMOS transistor that constitutes the first column selection unit CS1, the PMOS transistors PM1 and PM2 that constitute the PMOS sense amplifier PSA, the NMOS transistors NM1 and NM2 that constitute the NMOS sense amplifier NSA, the NMOS transistors that constitute the equalization unit EQ and the precharge unit PCH, and the NMOS transistor that constitutes the second column selection unit CS2.

In the layout CS1L of the first column selection unit CS1, a gate GATE and an active area ACT of the NMOS transistor that constitutes the first column selection unit CS1 are illustrated. The layouts of the other MOS transistors in the figure are illustrated in the same manner.

The NMOS transistor of the first column selection unit CS1, the NMOS transistors NM1 and NM2 of the NMOS sense amplifier NSA, the NMOS transistors of the equalization unit EQ and the precharge unit PCH, and the NMOS transistor of the second column selection unit CS2 are formed on a P-type substrate PSUB. In contrast, the PMOS transistors PM1 and PM2 of the PMOS sense amplifier PSA are formed in an N-type well NWELL in the P-type substrate PSUB.

As illustrated in FIG. 4, the MOS transistors that constitute the PMOS sense amplifier PSA and the NMOS sense amplifier NSA are asymmetrical with respect to a bit line BL and a complementary bit line BLB, and the MOS transistors of the equalization unit EQ and the precharge unit PCH are asymmetrical with respect to the bit line BL and the complementary bit line BLB since the MOS transistors are located on the right part of the layout of the sense amplifier block. Thus, the coupling capacitances of the bit line BL and the complementary bit line BLB that are generated when a data write operation or a data read operation of the semiconductor memory device is performed, are different from each other. Accordingly, the sensing operation of the bit line sense amplifier for a data write operation or a data read operation may be unstable.

SUMMARY OF EMBODIMENTS

Embodiments provide a bit line sense amplifier of a semiconductor memory device, which is capable of stably performing a sensing operation.

An aspect of the present invention provides a bit line sense amplifier of a semiconductor memory device with an open bit line structure, the bit line sense amplifier comprising a plurality of sense amplifier blocks including a first sense amplifier and a second sense amplifier, each sensing and amplifying a signal difference between a bit line and a complementary bit line; first voltage drivers applying a power source voltage to the first sense amplifier; and a second voltage driver applying a ground voltage to the second sense amplifier. Each of the first voltage drivers may be disposed for every two or more sense amplifier blocks in a bit line sense amplifier region in which the sense amplifier blocks are arranged. The second voltage driver may be disposed in a conjunction region in which a control circuit is located to control the sense amplifier blocks.

The first voltage driver may comprise a PMOS transistor, and the second voltage driver may comprise an NMOS transistor.

The size of the NMOS transistor of the second voltage driver may be greater than the size of the PMOS transistor of the first voltage driver.

The first sense amplifier may be a PMOS sense amplifier having PMOS transistors, and the second sense amplifier may be an NMOS sense amplifier having NMOS transistors.

The PMOS transistor of the first voltage driver and the PMOS transistors of the first sense amplifier may be formed in an N-type well in a P-type substrate. A source that is included in the PMOS transistor of the first voltage driver and connected to the power source voltage may be adjacent to a high-density N-type impurity diffusion region to which the power source voltage is applied.

Each of the sense amplifier blocks may further comprise a first column selection unit either connecting the bit line to a local input/output line that is connected to a data input/output pin, or disconnecting them from each other, in response to a signal transmitted via a first column selection line; an equalization unit equalizing a voltage of the bit line with a voltage of the complementary bit line, in response to a signal transmitted via a precharge/equalization signal line; a precharge unit precharging the voltage of the bit line and the voltage of the complementary bit line, in response to the signal transmitted via the precharge/equalization signal line; and a second column selection unit either connecting the complementary bit line to a complementary local input/output line that is connected to the data input/output pin, or disconnecting them from each other, in response to a signal transmitted via a second column selection line.

Another aspect of the present invention provides a bit line sense amplifier of a semiconductor memory device with an open bit line structure, the bit line sense amplifier comprising a plurality of sense amplifier blocks sensing and amplifying a signal difference between a bit line and a complementary bit line. Each of the sense amplifier blocks may comprise first and second PMOS sense amplifier transistors sensing and amplifying the signal difference between the bit line and the complementary bit line; first and second NMOS sense amplifier transistors sensing and amplifying the signal difference between the bit line and the complementary bit line; first and second sense amplifier drivers respectively applying a ground voltage to the first and second NMOS sense amplifier transistors; a first column selection unit either connecting the bit line to a local input/output line, which is connected to a data input/output pin, or disconnecting them from each other, in response to a signal transmitted via a first column selection line; an equalizing unit equalizing a voltage of the bit line with a voltage of the complementary bit line, in response to a signal transmitted via a precharge/equalization signal line; first and second precharge units precharging the voltages of the bit line and the complementary bit line, in response to a signal transmitted via the precharge/equalization signal line; and a second column selection unit either connecting the complementary bit line to a complementary local input/output line, which is connected to the data input/output pin, or disconnecting them from each other, in response to a signal transmitted via a second column selection line. The first column selection unit, the first sense amplifier driver, the first NMOS sense amplifier transistor, the first PMOS sense amplifier transistor, and the first precharge unit are arranged to be respectively symmetrical to the second column selection unit, the second sense amplifier driver, the second NMOS sense amplifier transistor, the second PMOS sense amplifier transistor, and the second precharge unit, with respect to the equalization unit. The first column selection unit, the first sense amplifier driver, the first NMOS sense amplifier transistor, the first PMOS sense amplifier transistor, and the first precharge unit may be arranged to be respectively symmetrical to the second column selection unit, the second sense amplifier driver, the second NMOS sense amplifier transistor, the second PMOS sense amplifier transistor, and the second precharge unit, with respect to the bit line and the complementary bit line.

The bit line sense amplifier may further comprise a PMOS sense amplifier driver applying a power source voltage to the first and second PMOS sense amplifier transistors. The PMOS sense amplifier driver may be disposed in a conjunction region in which a control circuit is located to control the sense amplifier blocks.

The size of the a MOS transistor included in the PMOS sense amplifier driver may be greater than the size of a MOS transistor included in each of the first and second sense amplifier drivers.

Each of the first column selection unit, the second column selection unit, and the first and second sense amplifier drivers may comprise an NMOS transistor. Each of the first and second precharge units and the equalization unit may comprise a PMOS transistor.

Each of the first column selection unit, the second column selection unit, and the first and second sense amplifier drivers may comprise a PMOS transistor. Each of the first and second precharge units, and the equalization unit may comprise an NMOS transistor.

A bit line sense amplifier of a semiconductor memory device according to the present invention is capable of stably performing a sensing operation for a data read/write operation.

BRIEF DESCRIPTION OF THE DRAWINGS

The above and other aspects and advantages of the present invention will become more apparent by describing in detail exemplary embodiments with reference to the attached drawings.

DETAILED DESCRIPTION OF THE EMBODIMENTS

Figure 1:
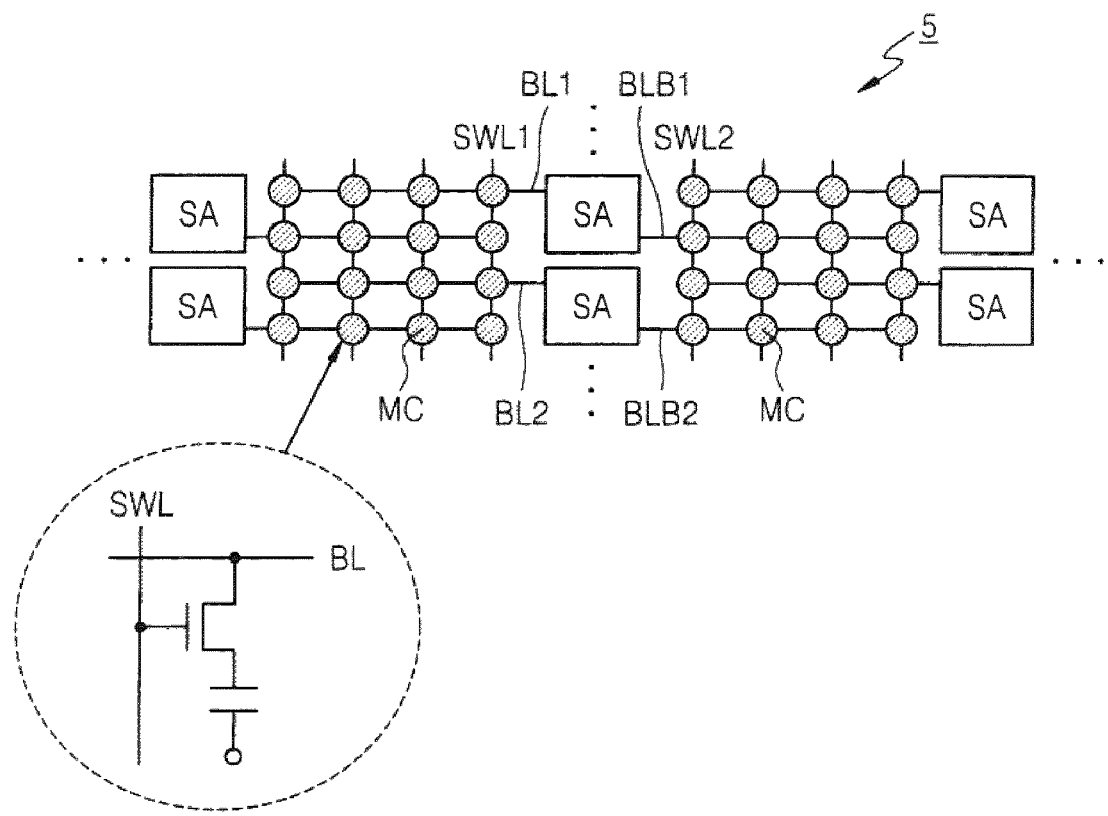
FIG. 1 illustrates a semiconductor memory device with an open bit line structure.

Hereinafter, exemplary embodiments of the present invention will be described in detail with reference to the accompanying drawings. Like reference numerals denote like elements throughout the drawings.

Figure 5:
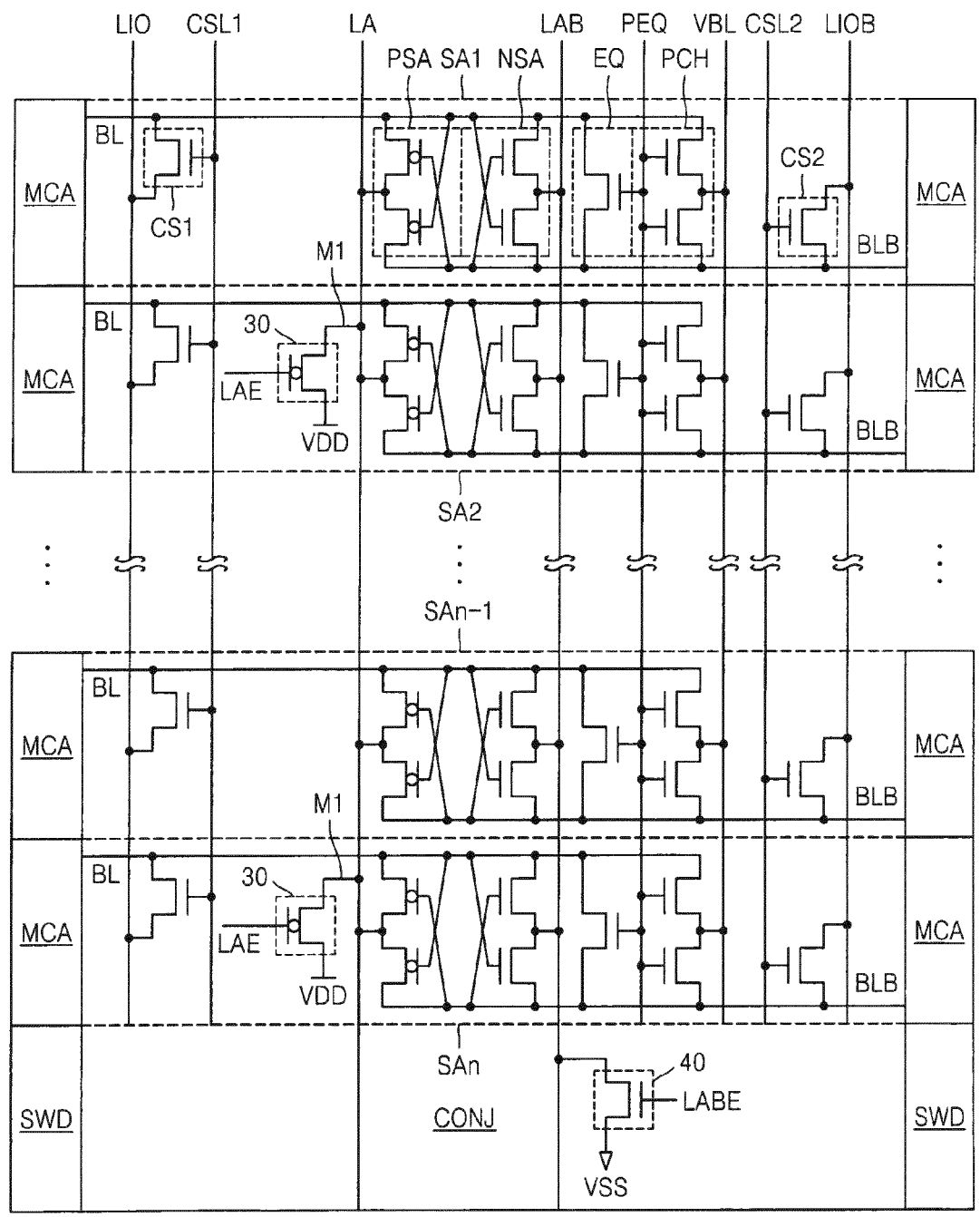
FIG. 5 illustrates a bit line sense amplifier of a semiconductor memory device according to an embodiment.

FIG. 5 illustrates a bit line sense amplifier of a semiconductor memory device according to an embodiment. The bit line sense amplifier includes a plurality of sense amplifier blocks SA1 through SAn, a plurality of PMOS sense amplifier drivers (hereinafter referred to as "the PSA drivers") 30, and an NMOS sense amplifier driver (hereinafter referred to as "the NSA driver") 40.

The sense amplifier blocks SA1 through SAn are respectively located between memory cell regions MCA in which a plurality of memory cells are arranged. The PSA drivers 30 are distributed in a bit line sense amplifier region in which a bit line sense amplifier is located in order to improve the sensing capability of a PMOS sense amplifier PSA. For example, each of the PSA drivers 30 may be located for every two or more sense amplifier blocks. Each of the PSA drivers 30 is located between an NMOS transistor that constitutes a first column selection unit CS1 of one of the sense amplifier blocks SA1 through SAn, and PMOS transistors that constitute a PMOS sense amplifier PSA of one of the PMOS transistor sense amplifier blocks SA1 through SAn.

As illustrated in FIG. 5, each of the PSA drivers 30 (first voltage drivers) may be connected to a power source voltage supply line LA via a first metal line M1, and thus, a resistance value between the PSA driver 30 and the power source voltage supply line LA is comparatively small. Thus, the PSA driver 30 is capable of stably applying the power source voltage VDD.

The NSA driver 40 (second voltage driver) includes an NMOS transistor that is larger than a PMOS transistor included in the PSA driver 30, and is located in a conjunction region CONJ between sub-word line driver regions SWD. In the sub-word line driver regions SWD, a sub-word line driver is located to drive a sub-word line connected to a cell transistor of a memory cell in the memory cell region MCA. The sub-word line is connected to a main word line via a sub-word line driver. In the conjunction region CONJ, a control circuit is located to control the sub-word line driver and the bit line sense amplifier.

The NMOS transistor of the NSA driver 40 is located in the conjunction region CONJ in which a layout of a MOS transistor can be performed more easily than the bit line sense amplifier region and in which a P-type substrate is formed. And thus, the size of the NMOS transistor of the NSA driver 40 may be increased without necessarily needing to increase the size of the semiconductor memory device. Accordingly, the large NMOS transistor, with an increased current capacity, for example, of the NSA driver 40 is capable of stably applying ground voltage VSS to the NMOS sense amplifier NSA, while physical sizes are optimized.

The first sense amplifier block SA1 includes the first column selection unit CS1, a PMOS sense amplifier PSA, an NMOS sense amplifier NSA, an equalization unit EQ, a precharge unit PCH, and a second column selection unit CS2.

The first column selection unit CS1 either connects a bit line BL to a local input/output (I/O) line LIO that is connected to a data I/O pin, or disconnects them from each other, in response to a signal transmitted via the first column selection line CSL1. The first column selection unit CS1 includes an NMOS transistor.

The PMOS sense amplifier PSA senses and amplifies a signal difference between the bit line BL and a complementary bit line BLB, in response to a power source voltage VDD applied via the power source voltage supply line LA. The PMOS sense amplifier PSA includes PMOS transistors. The PSA drivers 30 applies the power source voltage VDD to the PMOS sense amplifier PSA via the power source voltage supply line LA, in response to a first sensing enable signal LAE.

The NMOS sense amplifier NSA amplifies the signal difference between the bit line BL and the complementary bit line BLB, in response to the ground voltage VSS applied via a ground voltage supply line LAB. The NMOS sense amplifier NSA includes NMOS transistors. The NSA driver 40 applies the ground voltage VSS to the NMOS sense amplifier NSA via the ground voltage supply line LAB, in response to a second sensing enable signal LABE.

The equalization unit EQ equalizes the voltage of the bit line BL with the voltage of the complementary bit line BLB, in response to a signal transmitted via a precharge/equalization signal line PEQ. The equalization unit EQ includes an NMOS transistor.

The precharge unit PCH precharges the voltages of the bit line BL and the complementary bit line BLB to a precharge voltage, i.e., a power source voltage (VDD)/2, in response to the signal transmitted via the precharge/equalization signal line PEQ. The precharge unit PCH includes NMOS transistors. The precharge voltage is applied via a precharge voltage line VBL.

The second column selection unit CS2 either connects the complementary bit line BLB to a complementary local I/O line LIOB that is connected to the data I/O pin, or disconnects them from each other, in response to a signal transmitted via a second column selection line CSL2. The second column selection unit CS2 includes an NMOS transistor.

The elements of each of the second through $n^{th}$ sense amplifier blocks SA2 through SAn are the same as those of the first sense amplifier block SA1.

According to an embodiment, a bit line sense amplifier of a semiconductor memory device includes a PSA driver and an NSA driver that are respectively capable of stably applying a power source voltage and a ground voltage, thereby enabling the bit line sense amplifier to stably perform a sensing operation.

Figure 6:
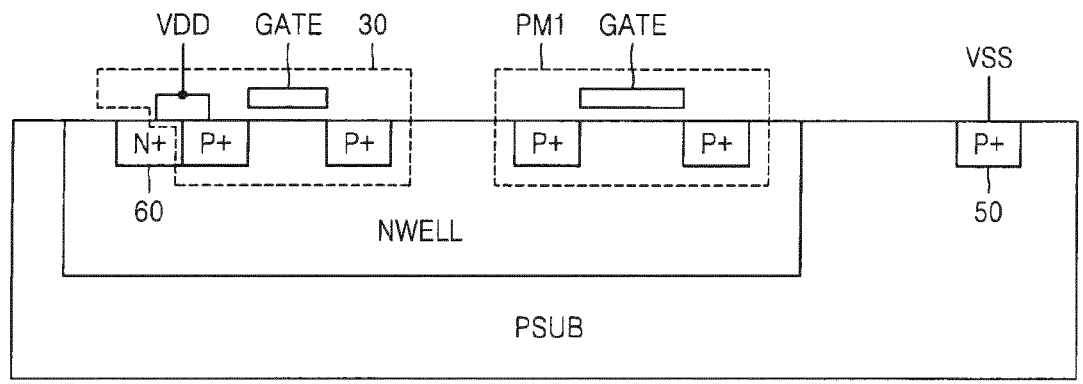
FIG. 6 illustrates the PMOS transistor of the PSA driver and the PMOS transistor of the PSA shown in FIG. 5.

FIG. 6 is a cross-sectional view illustrating the PMOS transistor of the PSA driver 30 and the PMOS transistor of the PMOS sense amplifier PSA illustrated in FIG. 5. Referring to FIG. 6, an N-type well NWELL and a high-density P-type (P+) impurity diffusion region 50 are formed in a P-type substrate PSUB. The ground voltage VSS (substrate bias) may be applied to the high-density P-type impurity diffusion region 50 so that the P-type substrate PSUB and the N-type well NWELL are not forward-biased.

Formed in the N-type well NWELL are a high-density N-type (N+) impurity diffusion region 60, the PMOS transistor that constitutes the PSA driver 30, and the PMOS transistor PM1 of PMOS transistors that constitute the PMOS sense amplifier PSA. For convenience of explanation, FIG. 6 illustrates only one PMOS transistor PM1 of the PMOS transistors that constitute the PMOS sense amplifier PSA.

A power source voltage VDD (well bias voltage) is applied to the high-density N-type impurity diffusion region 60 so that the P-type substrate PSUB and the N-type well NWELL are not forward-biased.

The PMOS transistor 30 includes a high-density P-type impurity diffusion region (source) connected to the power source voltage VDD, a gate electrode GATE, and a high-density P-type impurity diffusion region (drain). The source of the PMOS transistor 30 is adjacent to the high-density N-type impurity diffusion region 60.

In the embodiment, the PMOS transistor PM1 also includes a high-density P-type impurity diffusion region (source), a gate electrode GATE, and a high-density P-type impurity diffusion region (drain).

Accordingly, in the layout of a bit line sense amplifier of a semiconductor memory device according to the present embodiment, the PMOS transistor 30 and the PMOS transistor PM1 can share the high-density N-type impurity diffusion region 60.

Figure 7:
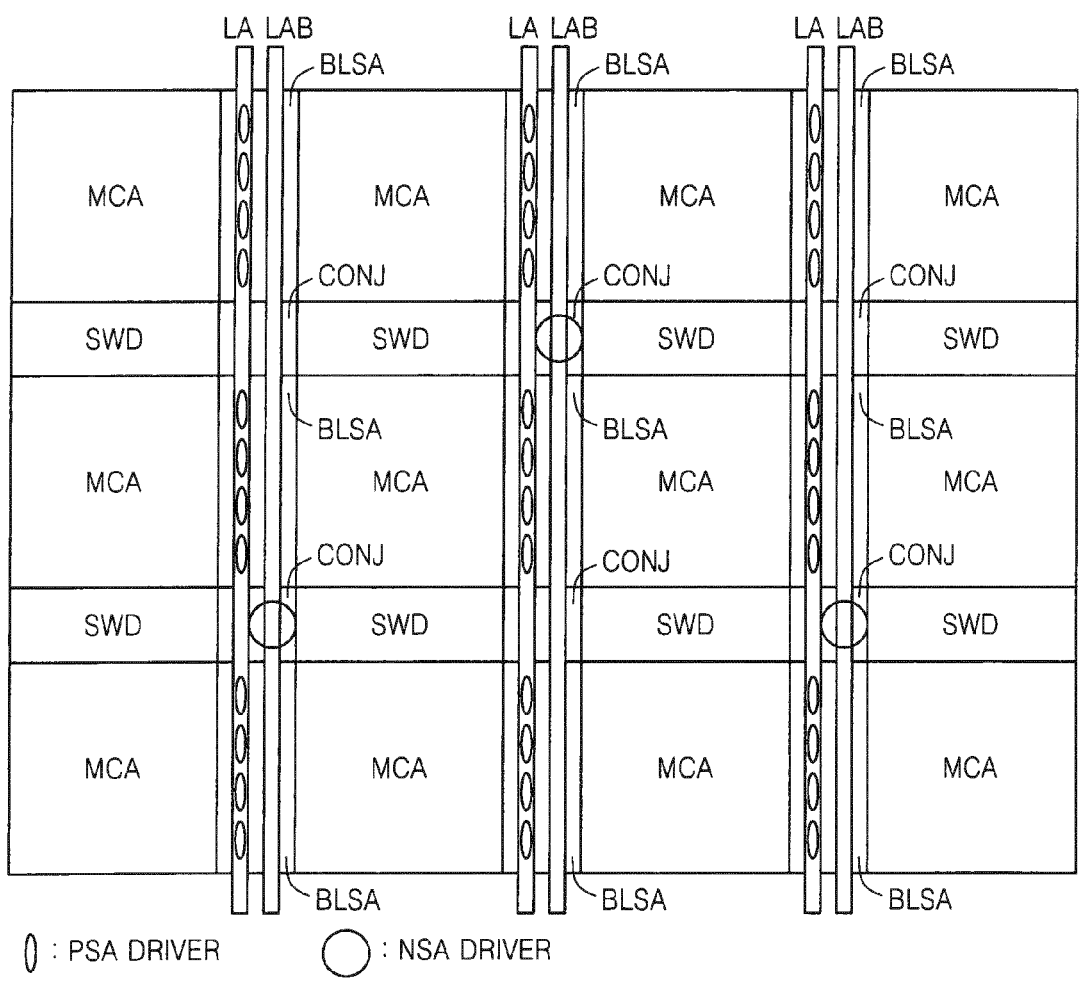
FIG. 7 illustrates the arrangement of the PSA driver and the NSA driver illustrated in FIG. 5.

FIG. 7 illustrates the locations of the PSA driver 30 and the NSA driver 40 illustrated in FIG. 5 according to an embodiment. Each PSA driver is disposed in a bit line sense amplifier region BLSA below a power source voltage supply line LA, and each NSA driver is disposed in a conjunction region CONJ below a ground voltage supply line LAB.

For example, FIG. 7 illustrates that one NSA driver is disposed to correspond to 8 PSA drivers. Also, PSA drivers, and an NSA driver corresponding to the PSA drivers are arranged in a zigzag fashion in order to reduce the size of a semiconductor memory chip.

Figure 8:
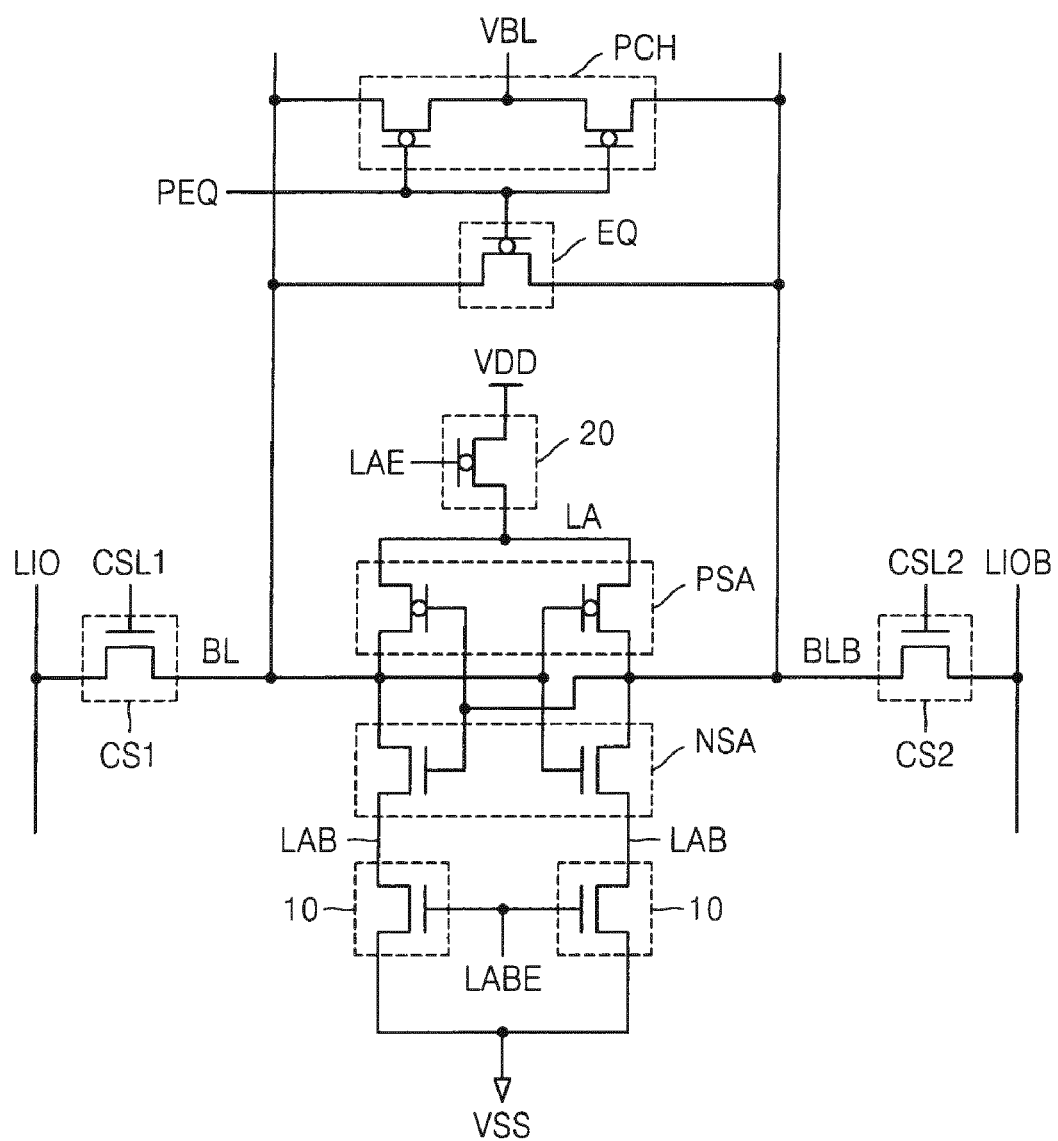
FIG. 8 illustrates a bit line sense amplifier of a semiconductor memory device according to another embodiment.

FIG. 8 illustrates a bit line sense amplifier of a semiconductor memory device according to another embodiment. The elements of the bit line sense amplifier are the same as those of the bit line sense amplifier of FIG. 2 except that they are arranged to be asymmetrical with respect to a bit line and a complementary bit line.

Referring to FIG. 8, the bit line sense amplifier of the semiconductor memory device includes a plurality of sense amplifier blocks, a plurality of NMOS sense amplifier drivers (NSA drivers) 10, and a PMOS sense amplifier driver (PSA driver) 20.

Figure 2:
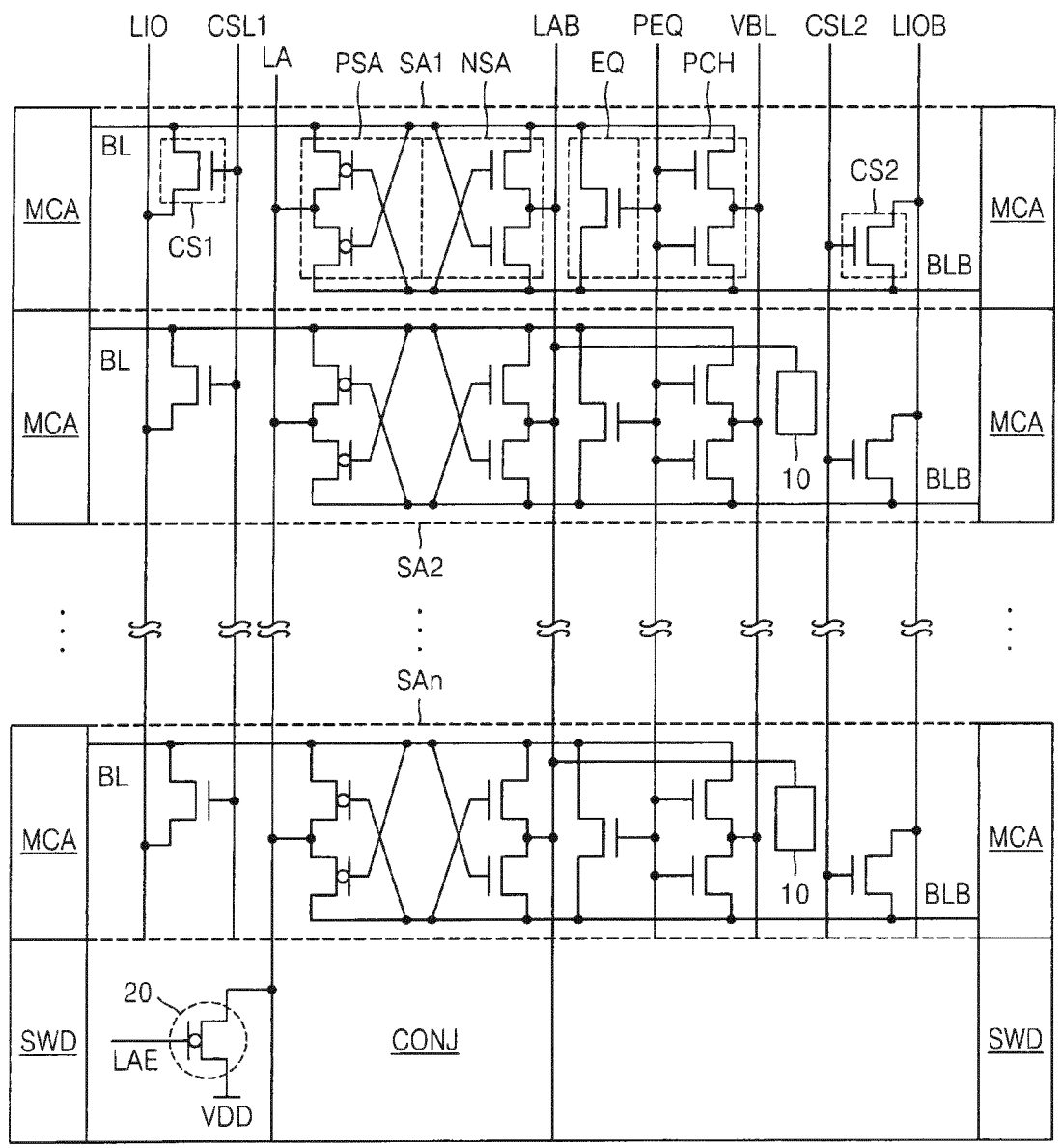
FIG. 2 illustrates the configuration of a bit line sense amplifier shown in FIG. 1.
Figure 3:
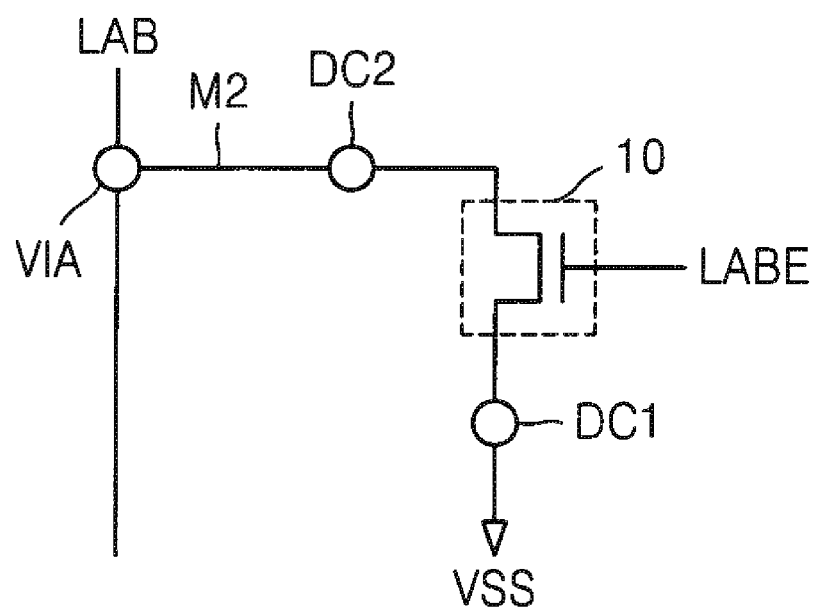
FIG. 3 illustrates a connection between an NSA driver and a ground voltage supply line, which are shown in FIG. 2.
Figure 4:
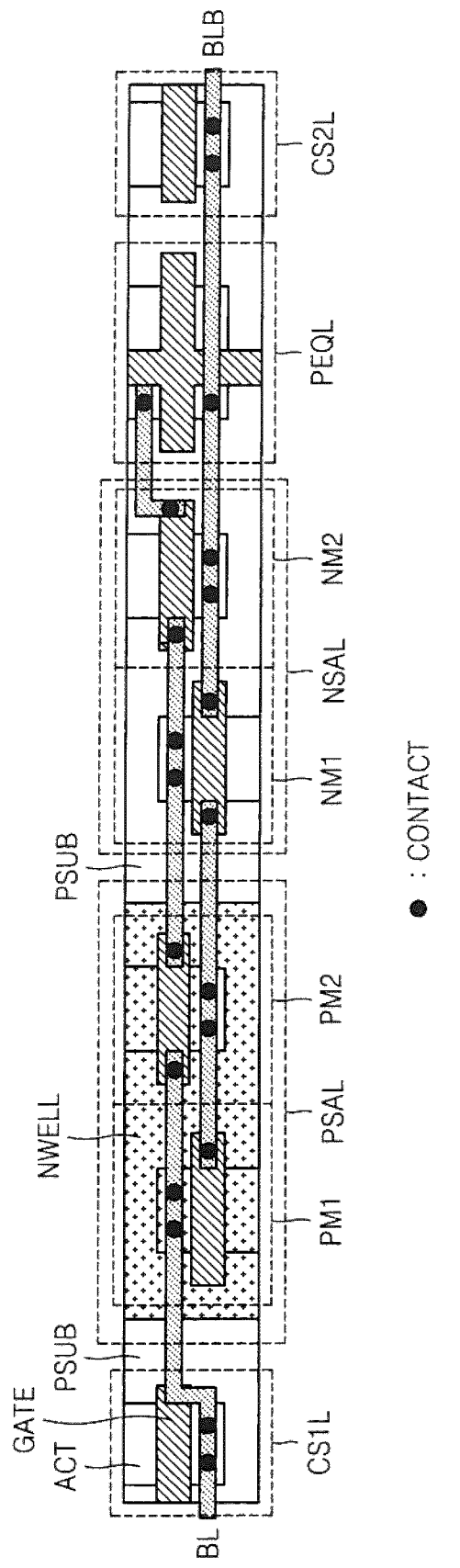
FIG. 4 is a layout diagram of the sense amplifier block of FIG. 2.

Each of the sense amplifier blocks includes a first column selection unit CS1, a PMOS sense amplifier PSA, an NMOS sense amplifier NSA, an equalization unit EQ, a precharge unit PCH, and a second column selection unit CS2. The first column selection unit CS1, the PMOS sense amplifier PSA, the NMOS sense amplifier NSA, the equalization unit EQ, the precharge unit PCH, and the second column selection unit CS2 illustrated in FIG. 8 are respectively similar to those described earlier, so another description will be omitted here. However, the MOS transistors that constitute the equalization unit EQ and the precharge unit PCH of FIG. 8 are PMOS transistors, but the MOS transistors that constitute the equalization unit EQ and the precharge unit PCH of FIG. 2 are NMOS transistors.

Figure 9:
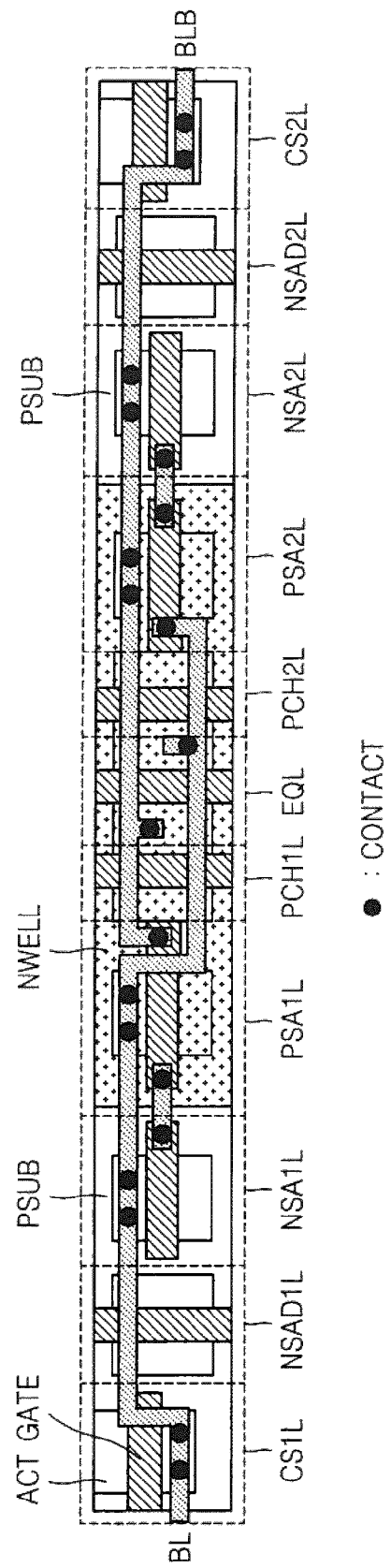
FIG. 9 shows an example of a layout of a sense amplifier block included in the bit line sense amplifier of FIG. 8.

FIG. 9 is a layout diagram of the sense amplifier block of the bit line sense amplifier of FIG. 8, according to an embodiment. CS1L, NSAD1L, NSA1L, PSA1L, PCH1L, EQL, PCH2L, PSA2L, NSA2L, NSAD2L, and CS2L respectively denote the layouts of an NMOS transistor that constitutes the first column selection unit CS1, an NMOS transistor that constitutes the NSA driver, one of NMOS transistors that constitute the NMOS sense amplifier NSA, one of PMOS transistors that constitute the PMOS sense amplifier PSA, one of PMOS transistors that constitute the precharge unit PCH, a PMOS transistor that constitutes the equalization unit EQ, another PMOS transistor of the PMOS transistors that constitute the precharge unit PCH, another PMOS transistor of the PMOS transistors that constitute the PMOS sense amplifier PSA, another NMOS transistor of the NMOS transistors that constitute the NMOS sense amplifier NSA, a NMOS transistor that constitutes the NSA driver, and an NMOS transistor that constitutes the second column selection unit CS2.

The layout CS1L of the first column selection unit CS1, a gate GATE and an active region ACT of the NMOS transistor of the first column selection unit CS1 are illustrated. The layouts of the other MOS transistors are illustrated in the same manner as that of the NMOS transistor of the first column selection unit CS1.

The NMOS transistor of the first column selection unit CS1, the NMOS transistors of the NSA drivers, and the NMOS transistors of the NMOS sense amplifier NSA are formed in a P-type substrate PSUB. The PMOS transistors of the PMOS sense amplifier PSA, the PMOS transistors of the precharge unit PCH, and the PMOS transistor of the equalization unit EQ are formed in an N-type well NWELL in the P-type substrate PSUB.

As illustrated in FIG. 9, corresponding elements of the bit line sense amplifier are arranged to be symmetrical to one another to the left and right sides of the equalization unit EQ and with respect to a bit line BL and a complementary bit line BLB. Thus, the coupling capacitances of the bit line BL and the complementary bit line BLB that are generated during a data write/read operation of the semiconductor memory device are equal to each other. Accordingly, a bit line sense amplifier of a semiconductor memory device according to this embodiment is capable of stably performing a sensing operation of the bit line sense amplifier to perform a data write/read operation.

Figure 10:
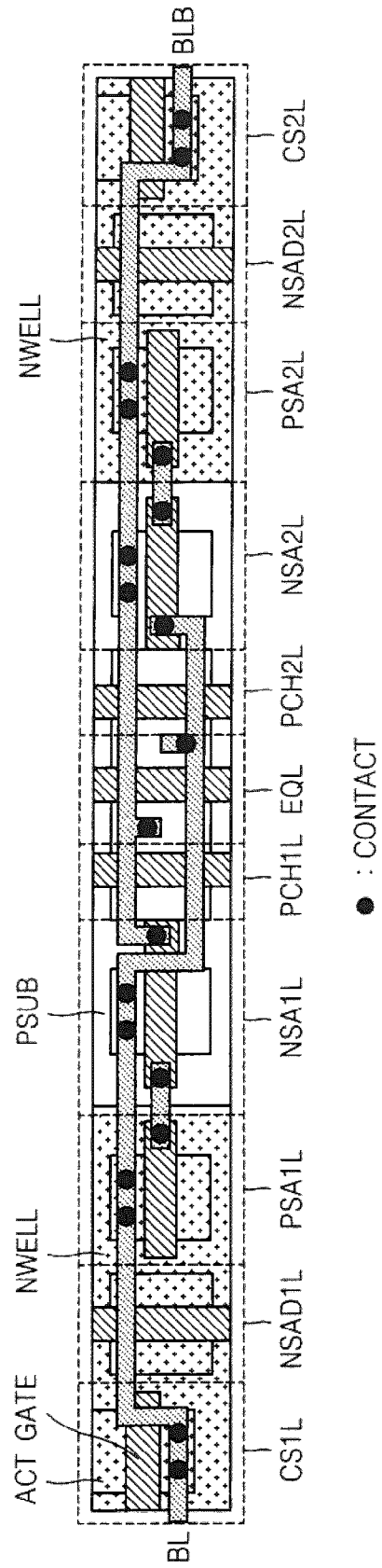
FIG. 10 shows another example of a layout of the sense amplifier block included in the bit line sense amplifier of FIG. 8.

FIG. 10 is a layout diagram of a sense amplifier block included in the bit line sense amplifier of FIG. 8, according to yet another embodiment. More specifically, compared to the sense amplifier block illustrated in FIG. 9, the types of MOS transistors that constitute the elements of the sense amplifier block of FIG. 10 are different, and the elements are arranged to be symmetrical with respect to a bit line and a complementary bit line. The activation level of a signal for controlling a MOS transistor varies depending on the types of the MOS transistor.

Referring to FIG. 10, CS1L, NSAD1L, PSA1L, NSA1L, PCH1L, EQL, PCH2L, NSA2L, PSA2L, NSAD2L, and CS2L respectively denote the layout of a PMOS transistor of the first column selection unit CS1, a PMOS transistor that constitutes the NSA driver, one of PMOS transistors that constitute the PMOS sense amplifier PSA, one of NMOS transistors that constitute the NMOS sense amplifier NSA, one of NMOS transistors that constitute the precharge unit PCH, an NMOS transistor that constitutes the equalization unit EQ, another NMOS transistor of the NMOS transistors that constitute the precharge unit PCH, another NMOS transistor of the NMOS transistors that constitute the NMOS sense amplifier NSA, another PMOS transistor of the PMOS transistors that constitute the PMOS sense amplifier PSA, a PMOS transistor that constitutes the NSA driver, and a PMOS transistor that constitutes the second column selection unit CS2.

In the layout CS1L of the first column selection unit CS1, a gate GATE and an active region ACT of the PMOS transistor that constitutes the first column selection unit C1 are illustrated. The layouts of the other MOS transistors are illustrated in the same manner as that of the PMOS transistor of the first column selection unit CS1.

The PMOS transistor of the first column selection unit CS1, the PMOS transistors of the NSA drivers, and the PMOS transistors of the PMOS sense amplifiers PSA are formed in an N-type well NWELL in a P-type substrate PSUB. The NMOS transistors of the NMOS sense amplifier NSA, the NMOS transistors of the precharge unit PCH, and the NMOS transistor of the equalization unit EQ are formed on the P-type substrate PSUB.

As illustrated in FIG. 10, corresponding elements of the bit line sense amplifier are arranged to be symmetrical to one another to the left and right sides of the equalization unit EQ and with respect to a bit line BL and a complementary bit line BLB. Thus, the coupling capacitances of the bit line BL and the complementary bit line BLB, which may be generated during a data write/read operation of the semiconductor memory device, are equal to each other. Accordingly, a bit line sense amplifier of a semiconductor memory device according to this embodiment is capable of stably performing a sensing operation of the bit line sense amplifier to perform a data write/read operation.

While embodiments of this invention have been particularly shown and described with reference to exemplary embodiments thereof, it will be understood by those skilled in the art that various changes in form and details may be made therein without departing from the spirit and scope of the invention as defined by the appended claims.

What is claimed is:

1. A bit line sense amplifier of a semiconductor memory device with an open bit line structure, the bit line sense amplifier comprising a plurality of sense amplifier blocks to sense and to amplify a signal difference between a bit line and a complementary bit line, wherein each of the sense amplifier blocks comprises:
PMOS and NMOS sense amplifier transistors to sense and to amplify the signal difference between the bit line and the complementary bit line;
sense amplifier drivers to respectively apply a ground voltage to the NMOS sense amplifier transistors;
column selection units to either connect the bit line to a local input/output line, which is connected to a data input/output pin, or to disconnect them from each other, in response to a signal transmitted via a column selection line;

an equalizing unit to equalize a voltage of the bit line with a voltage of the complementary bit line, in response to a signal transmitted via a precharge/equalization signal line; and precharge units to precharge the voltages of the bit line and the complementary bit line, in response to a signal transmitted via the precharge/equalization signal line;

wherein each of the column selection units, the sense amplifier drivers, the NMOS sense amplifier transistors, the PMOS sense amplifier transistors, and the precharge units are arranged to be respectively symmetrical about the equalization unit and the bit line and the complementary bit line.

2. The bit line sense amplifier of claim 1, further comprising a PMOS sense amplifier driver to apply a power source voltage to the PMOS sense amplifier transistors, wherein the PMOS sense amplifier driver is disposed in a conjunction region in which a control circuit is located to control the sense amplifier blocks.

3. The bit line sense amplifier of claim 2, wherein the size of a MOS transistor included in the PMOS sense amplifier driver is greater than the size of a MOS transistor included in each of the sense amplifier drivers.

4. The bit line sense amplifier of claim 1, wherein each of the column selection units and the sense amplifier drivers comprises an NMOS transistor, and each of the precharge units and the equalization unit comprises a PMOS transistor.

5. The bit line sense amplifier of claim 1, wherein each of the column selection units, and the sense amplifier drivers comprises a PMOS transistor, and each of the precharge units, and the equalization unit comprises an NMOS transistor.

* * * * *